(12) United States Patent
Tarabishi

(10) Patent No.: US 7,640,931 B2
(45) Date of Patent: Jan. 5, 2010

(54) REVOLUTIONARY SOLAR COLLECTING SYSTEM

(76) Inventor: M. Hisham Tarabishi, 381 Oaklawn Dr., Upper St. Clair, PA (US) 15241

(*) Notice: Subject to any disclaimer, the term of this patent is extended or adjusted under 35 U.S.C. 154(b) by 332 days.

(21) Appl. No.: 11/512,913

(22) Filed: Aug. 30, 2006

(65) Prior Publication Data
US 2007/0137640 A1   Jun. 21, 2007

Related U.S. Application Data

(60) Provisional application No. 60/751,694, filed on Dec. 19, 2005, provisional application No. 60/834,208, filed on Jul. 28, 2006.

(51) Int. Cl.
*F24J 2/38* (2006.01)
(52) U.S. Cl. .................. 126/607; 126/600; 359/597
(58) Field of Classification Search .......... 126/600, 126/607, 578, 572, 577, 573
See application file for complete search history.

(56) References Cited

U.S. PATENT DOCUMENTS

| | | | |
|---|---|---|---|
| 3,988,166 A | 10/1976 | Beam | |
| 4,038,971 A | 8/1977 | Bezborodko | |
| 4,135,493 A * | 1/1979 | Kennedy | 126/577 |
| 4,249,511 A * | 2/1981 | Krisst et al. | 126/608 |
| 4,286,581 A * | 9/1981 | Atkinson, Jr. | 126/585 |
| 4,297,000 A * | 10/1981 | Fries | 362/557 |
| 4,317,031 A * | 2/1982 | Findell | 250/203.4 |
| RE30,960 E * | 6/1982 | Sommer | 126/424 |
| 5,275,149 A | 1/1994 | Ludlow | |
| 6,128,135 A * | 10/2000 | Stiles et al. | 359/597 |
| 6,691,701 B1 * | 2/2004 | Roth | 126/685 |

* cited by examiner

*Primary Examiner*—Kenneth B Rinehart
*Assistant Examiner*—Chuka C Ndubizu
(74) *Attorney, Agent, or Firm*—The Webb Law Firm

(57) ABSTRACT

A revolutionary solar collecting system for effectively and efficiently harnessing the sun's energy is shown. The system tracks the sun and maintains a constant spatial focal point or sub-focal point to at least partially condense the sun's rays into a high-energy beam that may or may not be redirected to a predetermined location or locations for generating electrical power, heat energy, steam, and/or any other well-known applications In industry and research areas. The revolutionary system of the invention is low-cost, low maintenance, and is capable of significantly reducing energy costs.

46 Claims, 14 Drawing Sheets

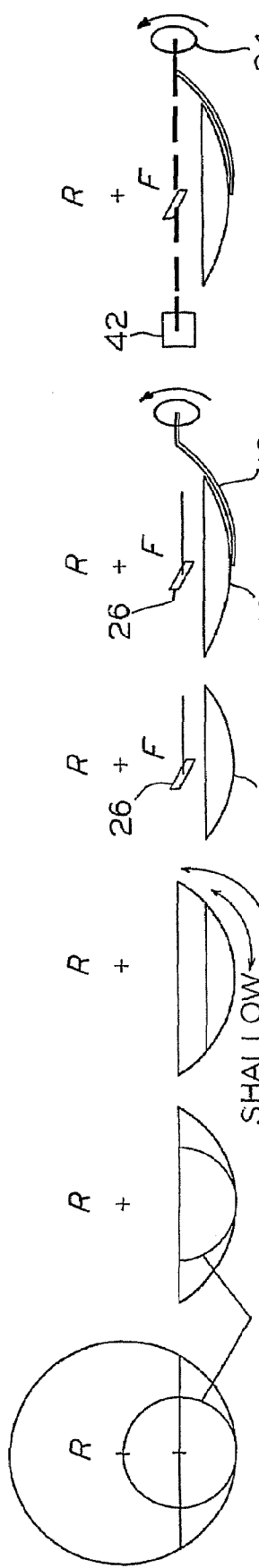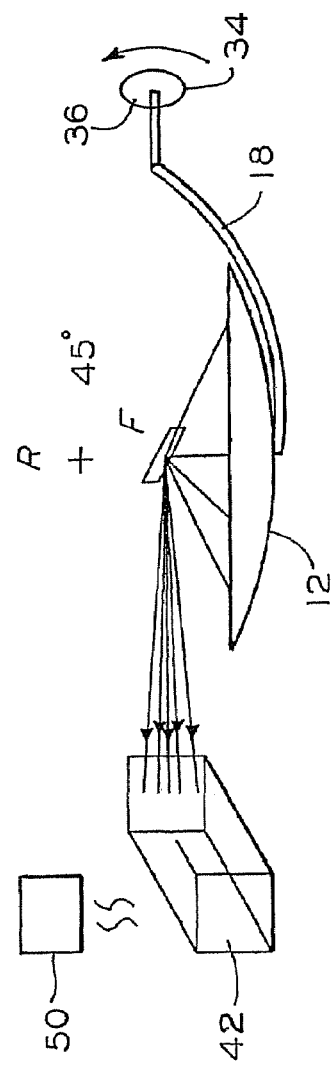
FIG. 3A  FIG. 3B  FIG. 3C  FIG. 3D  FIG. 3E  FIG. 3F
FIG. 3

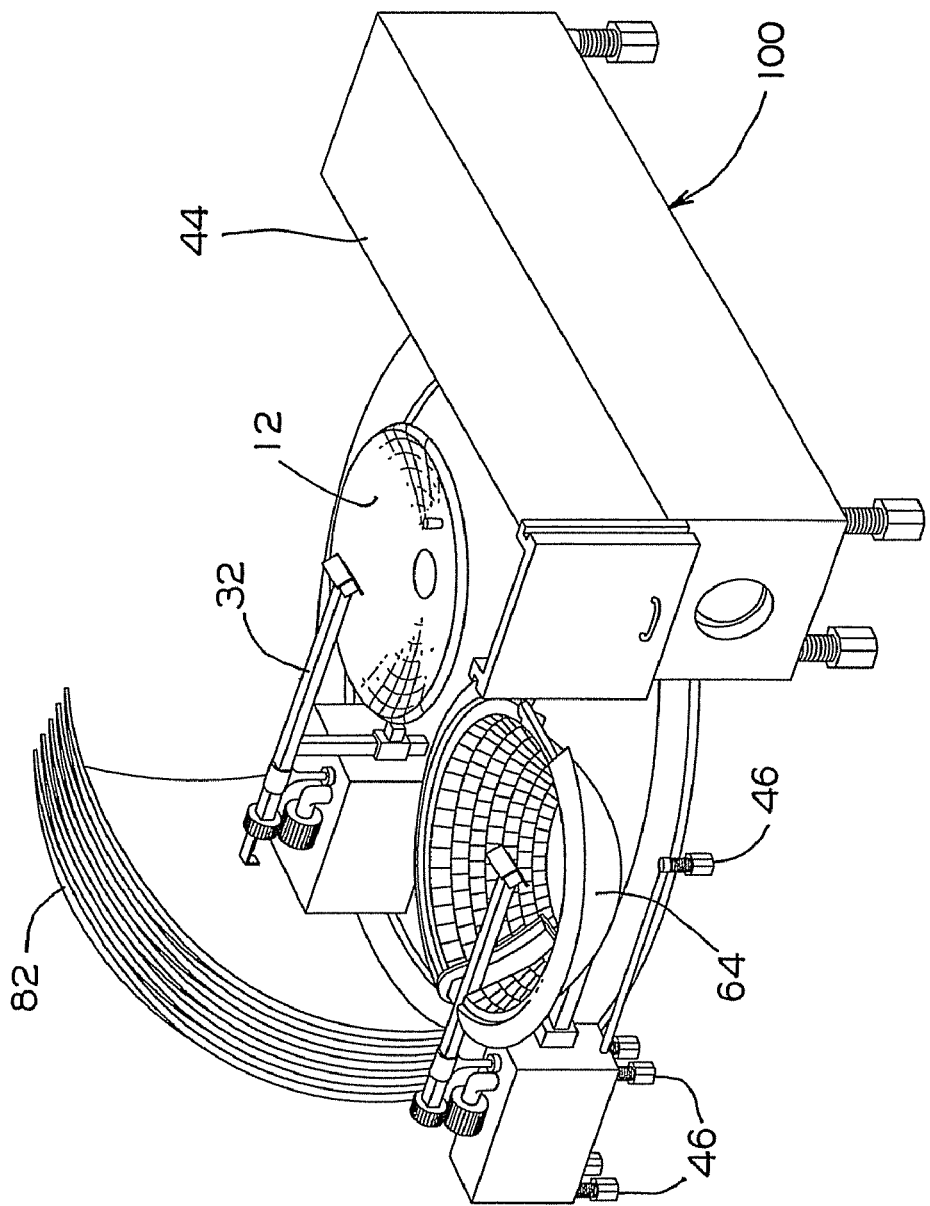
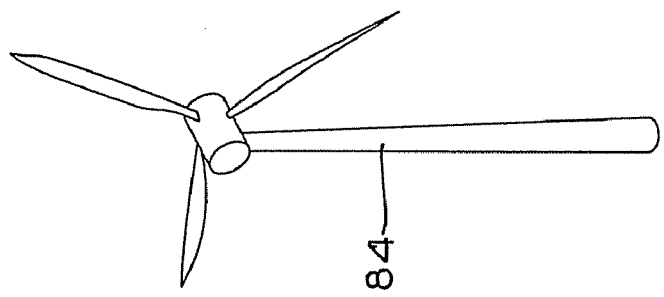
FIG. 12

REVOLUTIONARY SOLAR COLLECTING SYSTEM

CROSS-REFERENCES TO RELATED APPLICATIONS

This application is based on Provisional Application Ser. No. 60/751,694, filed Dec. 19, 2005 and Provisional Application Ser. No. 60/834,208, filed Jul. 28, 2006.

FIELD OF THE INVENTION

The present invention relates, in general, to a solar collecting system and, more particularly, to a solar collecting system that tracks the sun and maintains a constant focal point or sub-focal point to at least partially condense the sun's rays into a high-energy beam that is then redirected to a predetermined location for generating electrical power, heat energy, steam, and/or any other well-known application.

BACKGROUND OF THE INVENTION

Solar energy has been available as a source of power for more than 4.5 billion years. For centuries, inventors have been devising various means to harness this energy. As far back as the third century B.C., records indicate that the Greek and Roman armies used "burning mirrors" to focus sunlight as weapons of war to ignite fires and to burn sails of enemy warships. In 1767, Swiss scientist Herace de Saussure invented the first solar collector (solar hotbox). In the 1880's, engineer John Ericsson, the first American solar scientist, developed a solar driven engine for a ship and 1954 saw the birth of the solar cell or photovoltaic. In 1977, U.S. President Jimmy Carter installed solar panels on the White House and began promoting different incentives for companies that developed and/or used solar energy systems.

Solar energy provides the world either directly or indirectly with the majority of its energy. Solar energy is a renewable energy source having vast potential. Although solar energy is abundant, a major drawback is that it is diffuse and not available at all hours. Solar energy can be affected by the time of the day, the seasons, and the changing sun path in the sky as the earth's axis is not at a right angle to the sun but is tilted away at an angle of 23.5°.

For decades, inventors have tried various systems for harnessing this incredible energy source. For example, U.S. Pat. Nos. 3,988,166; 4,286,581; 5,275,149; and 4,038,971 have sought to control and convert this energy into a cost-effective usable form. Unfortunately, these systems are cumbersome, expensive to manufacture and maintain, expensive to operate and yield little in terms of usable, convertible energy.

Although state and federal incentives are available, it is not yet economical to harness solar energy on a large scale to produce electricity. However, the high cost of traditional energy sources and the energy shortage are presenting a significant burden on many countries. Also, these traditional sources have numerous drawbacks such as pollution and the limited amounts of fossil fuels available.

Solar energy is the hope for an endless energy supply, as it is cheap, clean, and pollution free. There is a need in the art to develop a cost effective, easy to operate, relatively maintenance free solar energy system to harness and convert solar energy into a viable energy alternative to traditional sources.

OBJECTS OF THE INVENTION

It is therefore an object of the invention to provide a solar energy collecting system that is a cost effective, relatively maintenance free alternative to traditional energy sources.

It is a further object of the invention to provide a solar energy collecting system that is capable of efficiently converting energy from the sun into electricity, heat energy and/or steam.

It is yet another object of the invention to provide a solar energy collecting system that is capable of being easily adjusted to maximize the sun's rays across the arc of the sky and according to seasonal changes.

It is still yet another object of the invention to provide a solar energy collecting system that is capable of condensing the sun's rays and redirecting them as needed to maximize their energy potential.

In addition to the various objects and advantages of the invention which have been described in some specific detail above it should be noted that various other objects and advantages of the present invention will become more readily apparent to those persons who are skilled in the relevant art from the following more detailed description, particularly, when such description is taken in conjunction with the attached drawing Figures and with the appended claims.

SUMMARY OF THE INVENTION

Briefly, and in accordance with the forgoing objectives, the invention comprises a solar collecting system for generating electrical power, heat energy, and/or steam comprising a parabolic solar collector panel having a predetermined radius capable of receiving rays of the sun moving along a first path. A first arm for mounting the solar collector panel in a position capable of receiving the rays and reflecting the rays along a second path to one of a focal point, which is ½ the predetermined radius of the collector panel, and a sub-focal point, which is less than ½ this predetermined radius, where the rays become at least partially condensed. At least one deflecting mirror is mounted above the solar collector panel at substantially one of the focal point and the sub-focal point for receiving the condensed rays and redirecting these rays along at least a third path different from the first and second paths. A means is provided for mounting the at least one deflecting mirror. A gear assembly is attached to the first arm. The gear assembly has a center portion, which is inline with the focal point or the sub-focal point to form an imaginary axis. Means are provided for operating the gear assembly to rotate the collector panel according to movement of the sun such that the collector panel travels over an arc path, the center of which is either the focal point or sub-focal point of the collector panel. This collector panel travels over the arc path which is ½ of the radius or less than ½ the radius of the collector panel. The collector panel travels over the arc path, which is perpendicular with respect to the imaginary axis extending from the center portion of the gear assembly, one of the focal point and the sub-focal point, and a center portion of the deflecting mirror. The means for operating the gear assembly maintains the collector panel in a position, which is perpendicular with the sun's rays. A final target is provided for receiving the condensed rays from the third path and converting these rays into one of electrical power, heat energy and/or steam.

BRIEF DESCRIPTION OF THE DRAWINGS

FIG. 3 shows the solar collecting system of the invention according to a first embodiment including a lens box for redirecting the rays to a predetermined direction.

FIGS. 3A-3F show the steps/components for designing the solar collecting system of FIG. 3.

FIGS. 8A-8E show the directional movement of the rays using the split mirror of FIG. 8.

FIG. 12 shows a practical application using the energy from the solar collecting system of the invention.

DETAILED DESCRIPTION OF THE DRAWINGS

Figure 1:
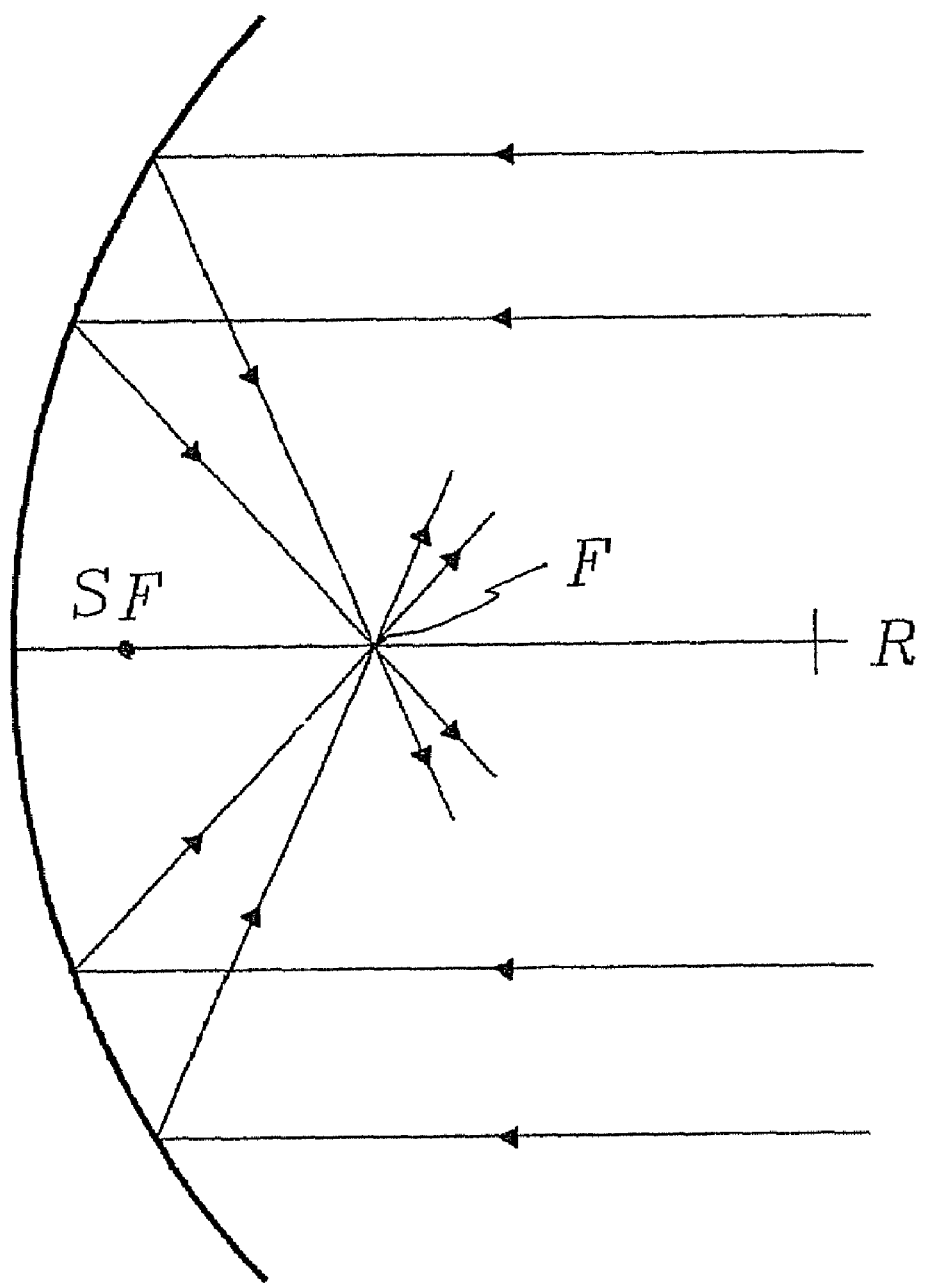
FIG. 1 shows a schematic drawing illustrating the directional movement of the sun's rays as they contact a parabolic member.

Prior to proceeding to a more detailed description of the invention, it should be noted that identical components having identical functions have been designated with identical reference numerals for the sake of clarity.

In order to adequately harness the sun's energy, it is necessary for a solar collector system to use a solar collector panel that is formed from a reflective material and has a substantial surface area. The best types of these collectors are in the form of parabolic, spherical, or concave mirror (s) having a predetermined radius. The rays from the sun shine down upon the surface of the collector panel and reflect back to what is called a "focal point". This focal point is ½ the radius of the parabolic collector panel. These rays become condensed at the focal point. By controlling the path of these condensed rays and then redirecting these rays as a single beam to a collecting and/or converting device, one is able to generate and convert a large amount of energy into a usable resource.

Referring now to FIGS. 3-12, there is shown a solar collecting system, generally indicated as 10, for generating electrical power, heat energy, and/or steam. The solar collecting system comprises a parabolic solar collector panel 12 having a predetermined radius "R" which is capable of receiving rays 14 of the sun moving along a first path 16. As shown in FIG. 1, these rays 14 are parallel to one another as they move along first path 16. The solar collecting panel 12 can be formed from any well-known reflective material such as a mirror or stainless steel and the like. Additionally, photovoltaic cells and photocells may be placed onto the panel in combination with the reflective material or the panel may be formed only from photovoltaic cells and/or photocells.

Figure 8:
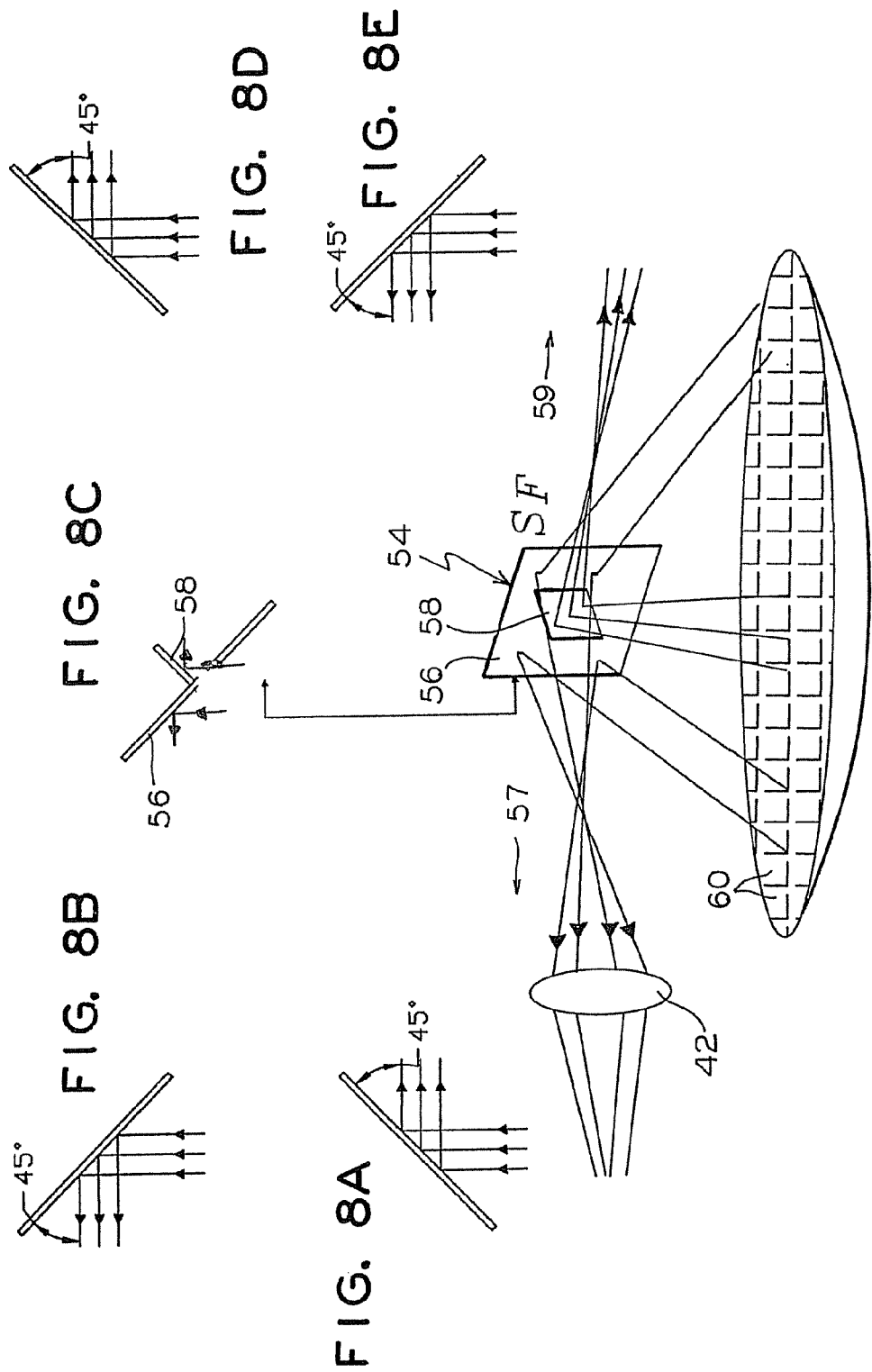
FIG. 8 shows the solar collecting system of the invention utilizing a split mirror mounted at the sub-focal position.

The system further comprises a first arm 18 having a first end 20 and a second end 22. The first end 20 has the solar collector panel 12 mounted thereon in a position capable of receiving the rays 14 moving along the first path 16 and reflecting these rays along a second path 24 to one of a focal point "F", as shown in FIG. 1, and/or a sub-focal point "SF", such as shown in FIG. 8, which is any location between the focal point "F" and the collector panel 12. The rays 14 become condensed to substantially a single beam at the focal point "F". At the sub-focal point "SF", the rays are partially condensed in such a manner that they may be gathered and redirected by the reflecting mirror 26.

The at least one deflecting mirror 26 is mounted above the solar collector panel 12 at either the focal point "F" or the sub-focal point "SF" for receiving the condensed, reflected rays moving along the second path 24 and redirecting these rays along at least a third path 28 which is different from the first 16 and second 24 paths.

Figure 4:
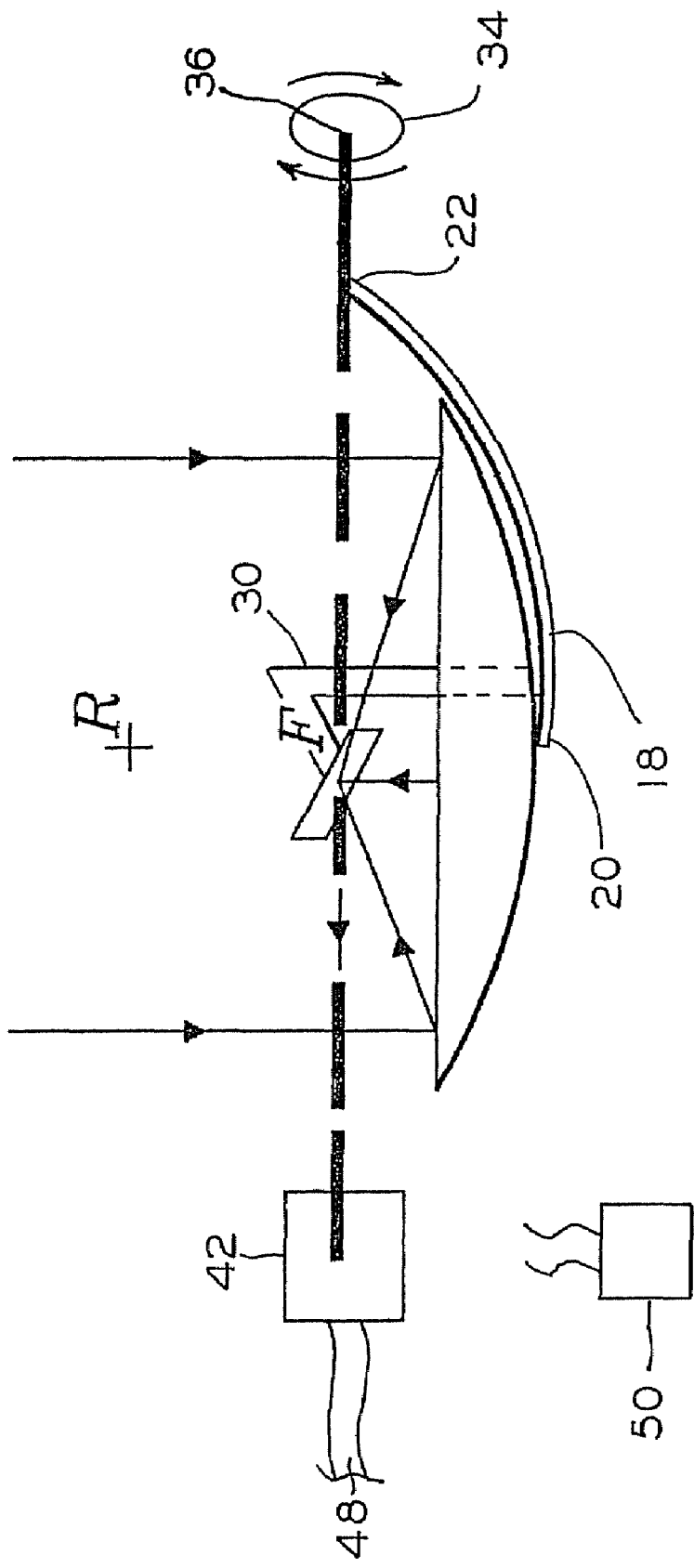
FIG. 4 shows the solar collecting system of the invention including mounting means for mounting the deflecting mirror with respect to the panel.

Means are provided for mounting the at least one deflecting mirror 26. This means can be any well-known mounting means such as a rod or pole 30, as shown in FIGS. 4 and 6, attached to the first arm 18 and extending perpendicular with respect to the collecting panel 12.

According to a second embodiment, as shown in FIGS. 9-12, a second arm 31, having a first end 32 and a second end 33 extends above and parallel with a portion of the collecting panel 12. In this embodiment, a crossbeam 35 extends between the first arm 18 and the second arm 31 for connecting this first arm 18 and second arm 31 to form a frame assembly 37.

Figure 6:
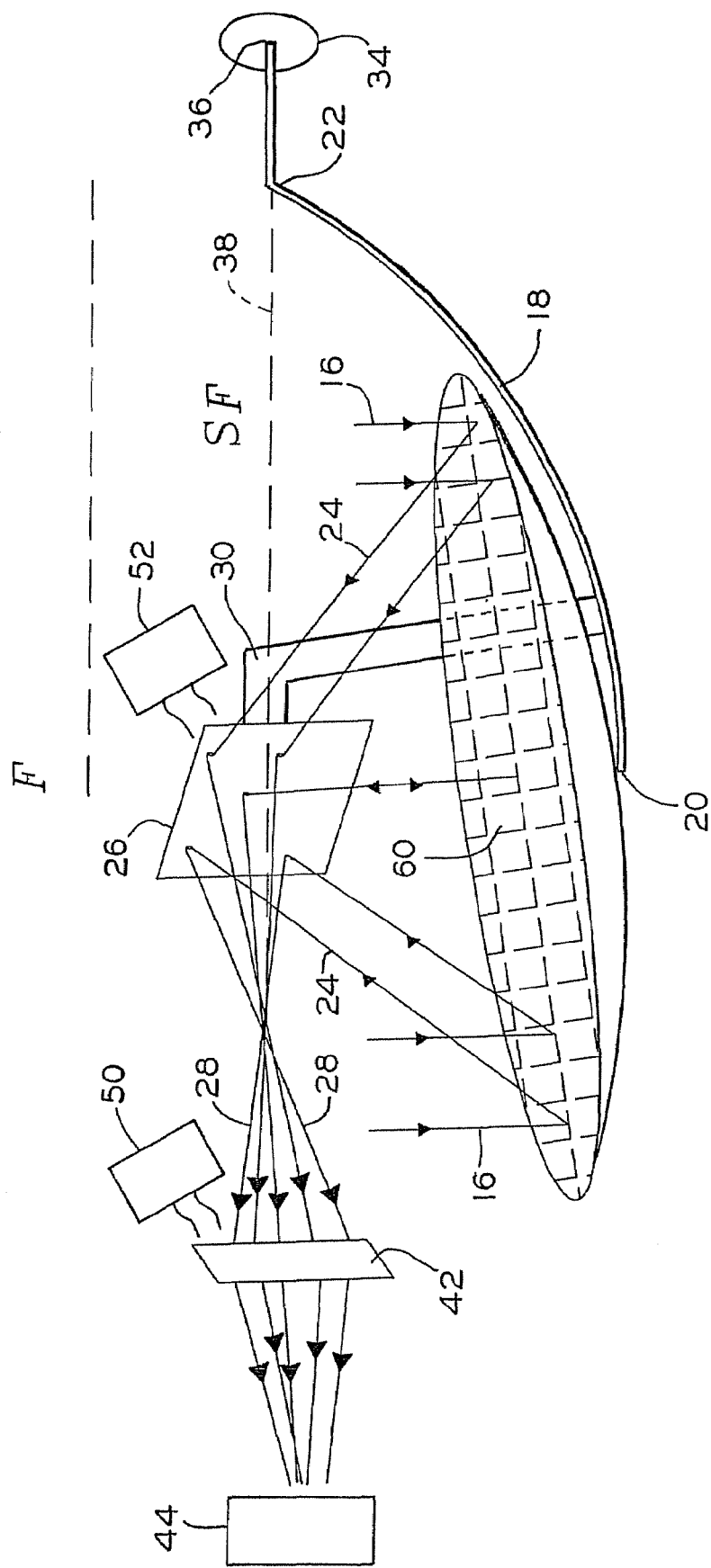
FIG. 6 shows the solar collecting system of the invention utilizing a collecting panel having a plurality of removable components.
Figure 7:
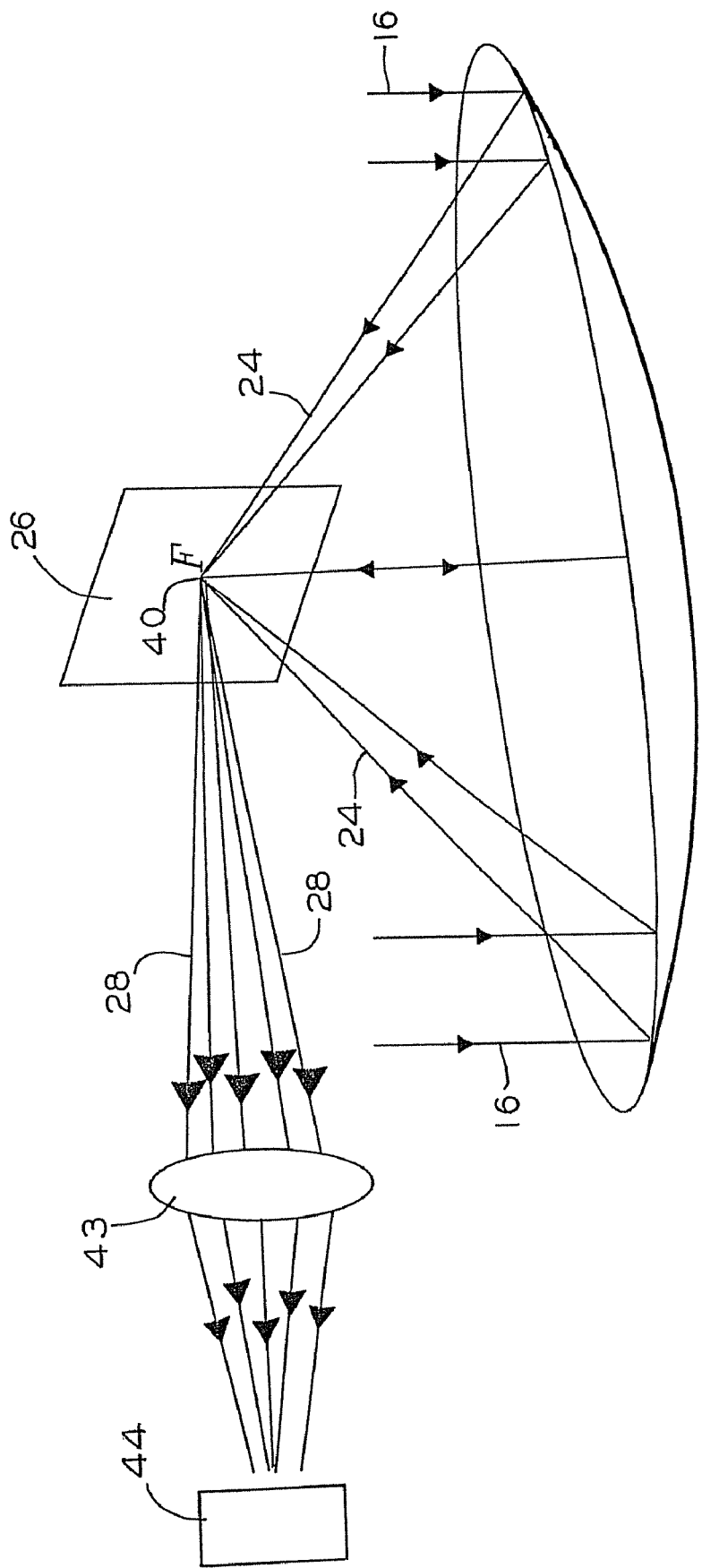
FIG. 7 shows the solar collecting system of the invention utilizing a lens frame and the deflecting mirror mounted at the focal point.

According to the first embodiment of FIGS. 3 and 6, a gear assembly 34 is attached to the second end 22 of the first arm 18. The gear assembly 34 has a center portion 36 that is inline with one of the focal point "F" and the sub-focal point "SF" to form an imaginary axis 38. According to the second embodiment shown in FIGS. 9-12, the gear assembly 34 is attached to the second end 33 of the second arm 31 such that the center portion 36 of the gear assembly is inline with the focal point "F" and/or the sub-focal point "SF".

Figure 2:
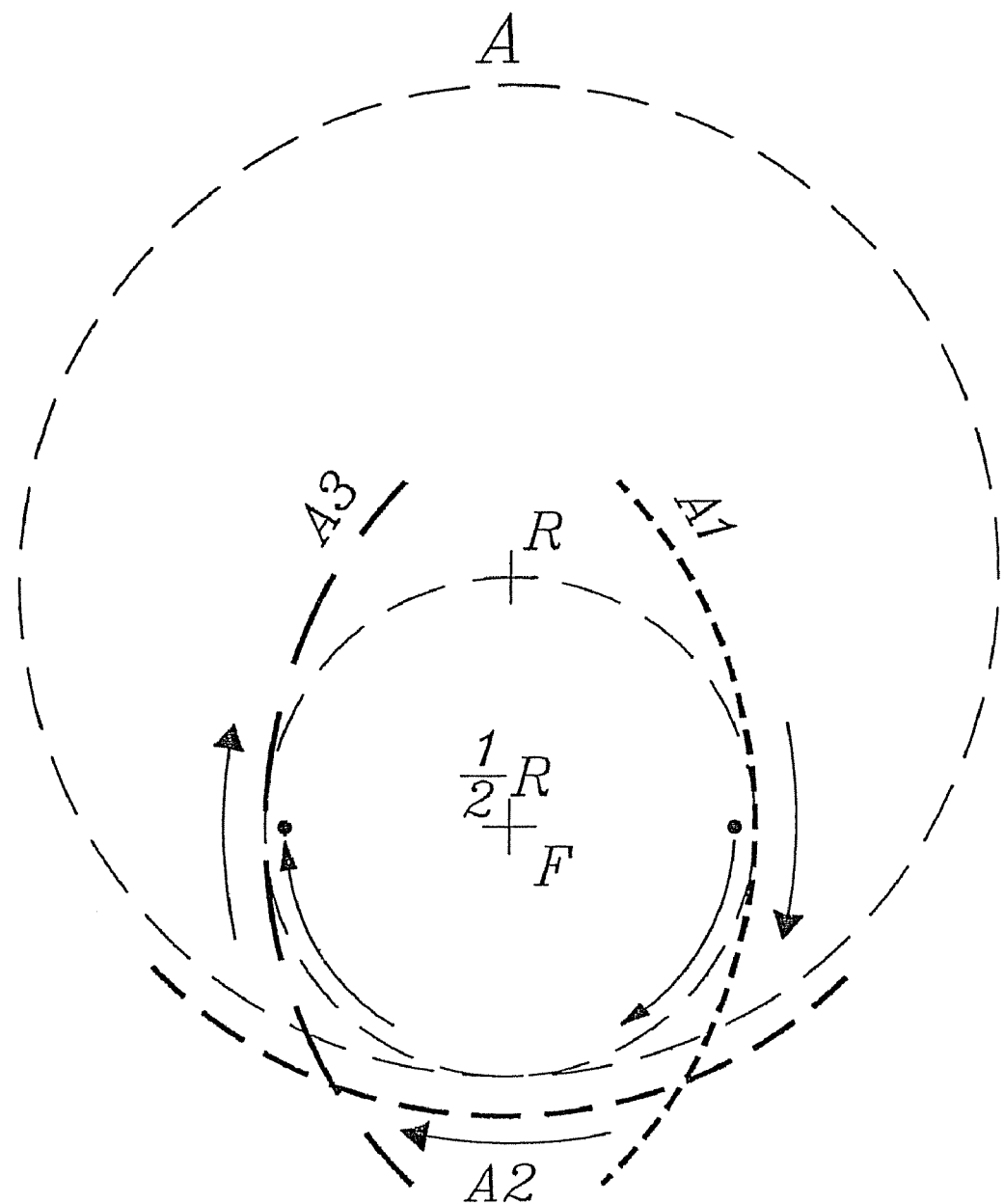
FIG. 2 shows a schematic drawing illustrating the arc path of a parabolic member as it rotates about the focus point of reflected, condensed rays.

Means, such as a motor, battery, photovoltaic energy, as discussed below, or any other well-known means, are provided for operating the gear assembly 34 to rotate the collector panel 12 and the deflecting mirror 26, or in the FIG. 9-12 embodiment, the frame assembly 37, according to movement of the sun. As shown in FIG. 2, the collector panel 12 travels over an arc path, "A1", "A2", "A3", the center of which is the focal point "F" of the collector panel 12. When the deflecting mirror 26 is at the focal point "F", this arc path is ½ the radius "R" of the collector panel. When the deflecting mirror 26 is at the sub-focal point "SF", this arc path is less than ½ the radius "R" of the collector panel. The collector panel 12 traveling over the arc path "A1", "A2", "A3" ensures that the collector panel 12 remains perpendicular with respect to the imaginary axis 38 extending from the center portion 36 of the gear assembly 34, either one of the focal point "F" or the sub-focal point "SF", and a center portion 40 of the deflecting mirror 26. By moving along this path, the collector panel 12 remains in a position that is perpendicular with the sun's rays at all times, maximizing the amount of sun energy applied to the collector panel 12.

A final target, such as a turbine 44 as shown in FIG. 12, is provided for receiving the condensed rays from the third path 28 and converting these rays into one of electrical power, heat energy and/or steam. It is recognized that any well-known target for receiving the condensed rays and converting these rays in a usable energy form may be provided.

As shown in FIGS. 3, 5, 7, and 8 a diffracting/refracting means may be provided along the imaginary axis 38 inline with the center portion 36 of the gear assembly 34 and the deflecting mirror 26. This diffracting/refracting means can comprise a lens box or frame 42 containing one or more lenses 43 to divert the rays moving along the third path 28 according to a predetermined location i.e. the final target 44. The at least one lens 43 can have one of a concave, convex, cylindrical shape, and any combination thereof capable of correcting any distortion of the condensed rays 14 being sent to the predetermined location.

A fiber optic cable 48, as shown in FIG. 4, can be provided which would allow for the movement of the condensed rays 14 from the diffracting/refracting means 42 to the final target 44.

A first means 50 for cooling one of the lens box and/or lens frame 42 and/or the fiber optic cable 48 can be provided. A second means 52 for cooling the deflecting mirror 26 can also be provided. These first and second cooling means 50, 52 can comprise any well-known cooling means such as a fan and the like.

It is well known that the sun is the highest over the Northern Hemisphere on June 21$^{st}$, which is the longest day of the year, and highest over the Southern hemisphere on December 21$^{st}$ or 22$^{nd}$ Consequently, the sun is at its lowest over the Northern Hemisphere when it is the highest over the Southern Hemisphere and vice versa. The sun is half way between the equinoxes at about March 21$^{st}$ and September 23$^{rd}$. The system of the present invention is capable of being easily adjusted to ensure that the solar collector panel remains perpendicular to the sun according to the season and the sun arc in the sky. These adjustments can be readily performed by one having ordinary skill in the art simply by changing the tilt of the collector system 10, such as via adjustment legs as shown in FIGS. 9-12, with respect to the location of the sun to optimize the amount of sun energy applied to the solar collector panel 12. Any other well-known means may be used to adjust the tilt of the collector system 10 of the invention.

As discussed above, parallel sunrays hitting the surface of a parabolic or spherical mirror that is facing the sun will result in the rays being reflected back to a focus point "F" which is ½ the radius of the sphere. The focus point "F" of the gathered sunrays shall also condense the temperature (thermal) to several folds (up to hundreds or thousands). Light, whether parallel or nonparallel, when hitting the surface of a regular mirror at a 45° shall get deflected 90°. The present invention capitalizes on these facts by mounting the at least one deflecting mirror 26 at an approximately 45° angle with respect to either the focal point or the sub-focal point. The sun travel from east to west is capable of concentrating the rays from the second path 24 at the focal point "F" (and at least partially condensing the rays at the sub-focal point "SF") and redirecting the rays along the third path 28 at an approximately 90° angle with respect to the first path 16. As the solar collector panel 12 and the deflecting mirror 26 rotate to follow the sun's path and maintain the sun's rays substantially perpendicular with respect to the panel, the deflecting mirror 26, mounted at the focus point "F" or a sub-focus point "SF", will continue to receive these condensed rays and redirect these rays to the desired target, 44. It should be noted that the deflecting mirror 26 may be pointed at the 45° angle in either the North or South position depending upon the location of the final target 44 so that the rays sent along the third path 28 are directed toward this final target 44.

FIGS. 8 and 9-12 show embodiments utilizing a split mirror 54 as the deflecting mirror 26. The split mirror 54 is preferable used when the deflecting mirror 26 is at the sub-focal point "SF", however, it can also be used when the deflecting mirror 26 is at the focal point "F". The split mirror 54 comprises a larger mirror 56 having a center mirror portion 58 mounted at an opposite angle with respect to the larger mirror 56. In this embodiment, and as shown in detail in FIGS. 8A-8E, the rays are split and sent in opposing directions. The larger mirror 56 is capable of redirecting a first portion of the condensed rays along a third path 57 and the center mirror 58 is capable of redirecting a second portion of the condensed rays along a fourth path 59 which is in an opposite direction from the third path 57. Preferably, the larger mirror 56 and the center mirror 58 are mounted at approximately 90° with respect to each other and mounted at an approximately 45° angle with respect to substantially one of the focal point "F" and/or the sub-focal point "SF" for redirecting the condensed rays along the third 57 and fourth 59 paths at approximately 90° with respect to first path 16 and at approximately 180° with respect to each other.

Figure 9:
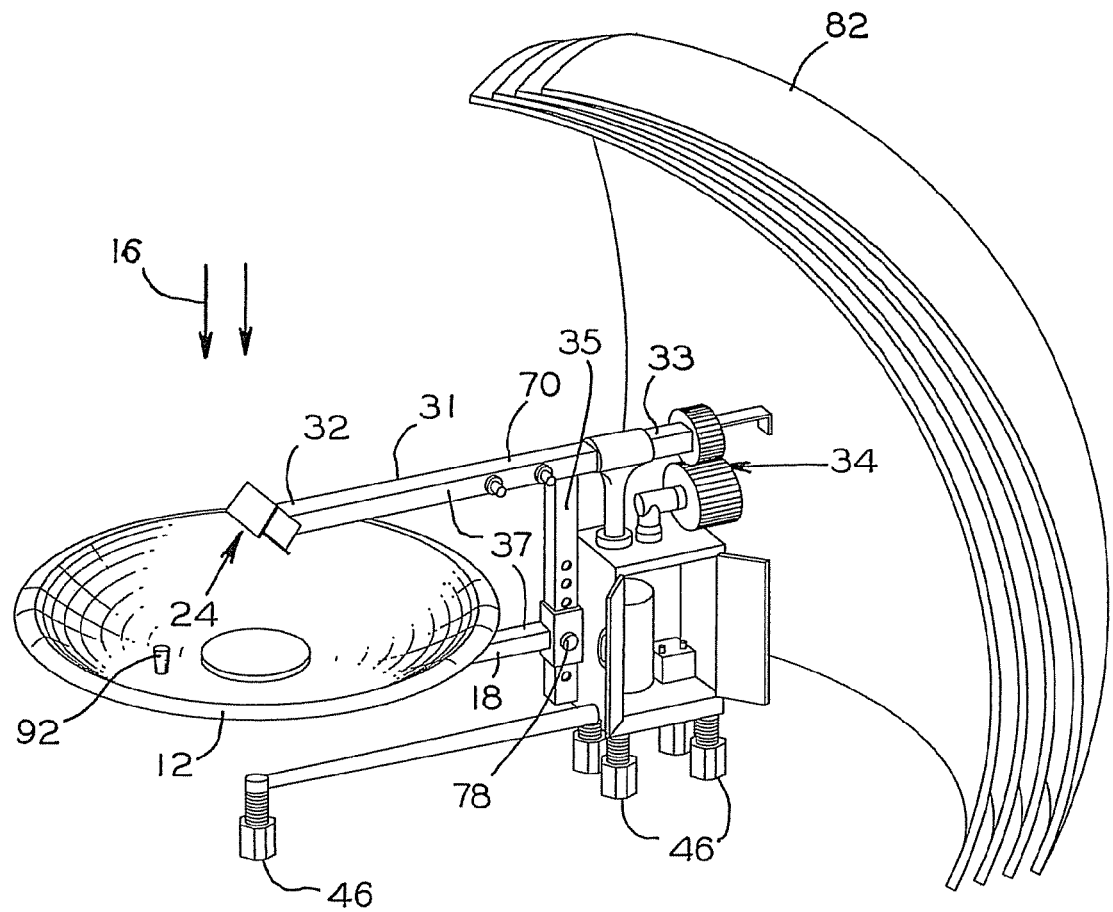
FIG. 9 shows the solar collecting system of the invention according to a second embodiment of the invention.
Figure 10:
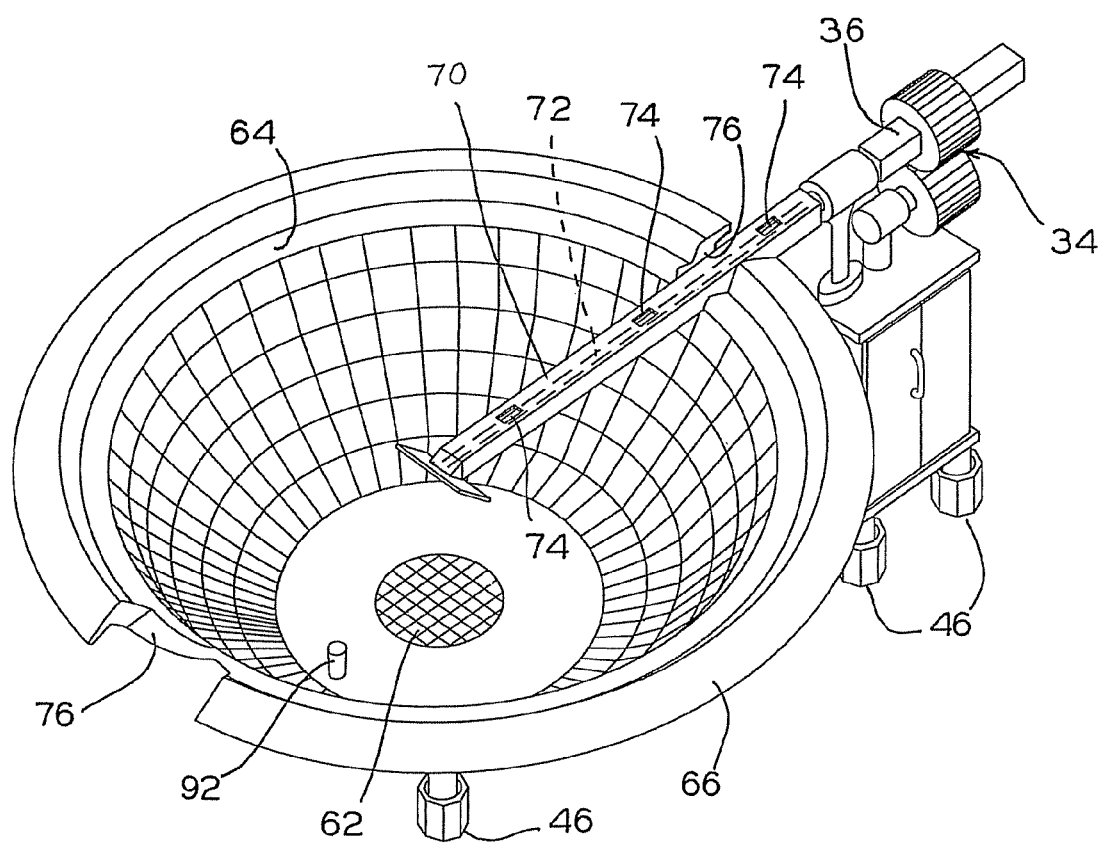
FIG. 10 shows the solar collecting system of FIG. 9 utilizing a deep dish collector panel.

The use of the split mirror 54 is especially advantageous with the design of the FIGS. 9-12 embodiment. As shown in FIG. 10, the second arm for mounting the deflecting mirror 26 comprises a tubular member 70 enclosing a fiber-optic cord 72 For transmitting the rays 14 along the fourth path 59. Valves 74 extending along the length of the tubular member 70 are provided to allow a cooling medium to circulate inside tubular member 70 and around the fiber optic cord 72 and adjacent to the split mirror deflecting mirror 54.

The solar collecting system 10 of the invention is designed such that the at least one deflecting mirror 26 is capable of being removed from the mounting means 30, 32 and the mounting means is capable of receiving a replacement deflecting mirror. This would allow one to change one of the size and/or shape of the deflecting mirror 26, replace the deflecting mirror with a split mirror 54, and/or to perform maintenance on the deflecting mirror.

The solar collecting panel 12 of the invention can comprise any shape capable of maintaining a constant focal point "F". For example, as opposed to the circular shape shown in the drawings, the collecting panel 12 can have straight edges so that a series of panels 12 may be mounted next to each other to maximize the amount of solar energy applied to the collector panels 12. Also, as shown in FIGS. 6 and 8, the collecting panel 12 can be formed from removable components comprising one of a series of multiple mirrors 60 of varying, sizes and/or shapes, a series of photovoltaic cells, and a combination of mirrors and photovoltaic cells as long as each of these components have the same predetermined radius "R" which is capable of maintaining the constant focal point "F". By forming the collector panel 12 from removable components 60 one is able to remove one or more components for maintenance and/or replacement thereof without the expense of having to replace the entire collector panel 12.

Additionally, one can provide at least one photovoltaic cell sheet 62 mounted on the solar collector panel, as shown in FIG. 10. The sun energy applied to this cell sheet is capable of providing enough energy for operating the motor of the gear assembly 34 and/or any other accessory item of the system 10 i.e. cooling fans and the like.

Figure 5:
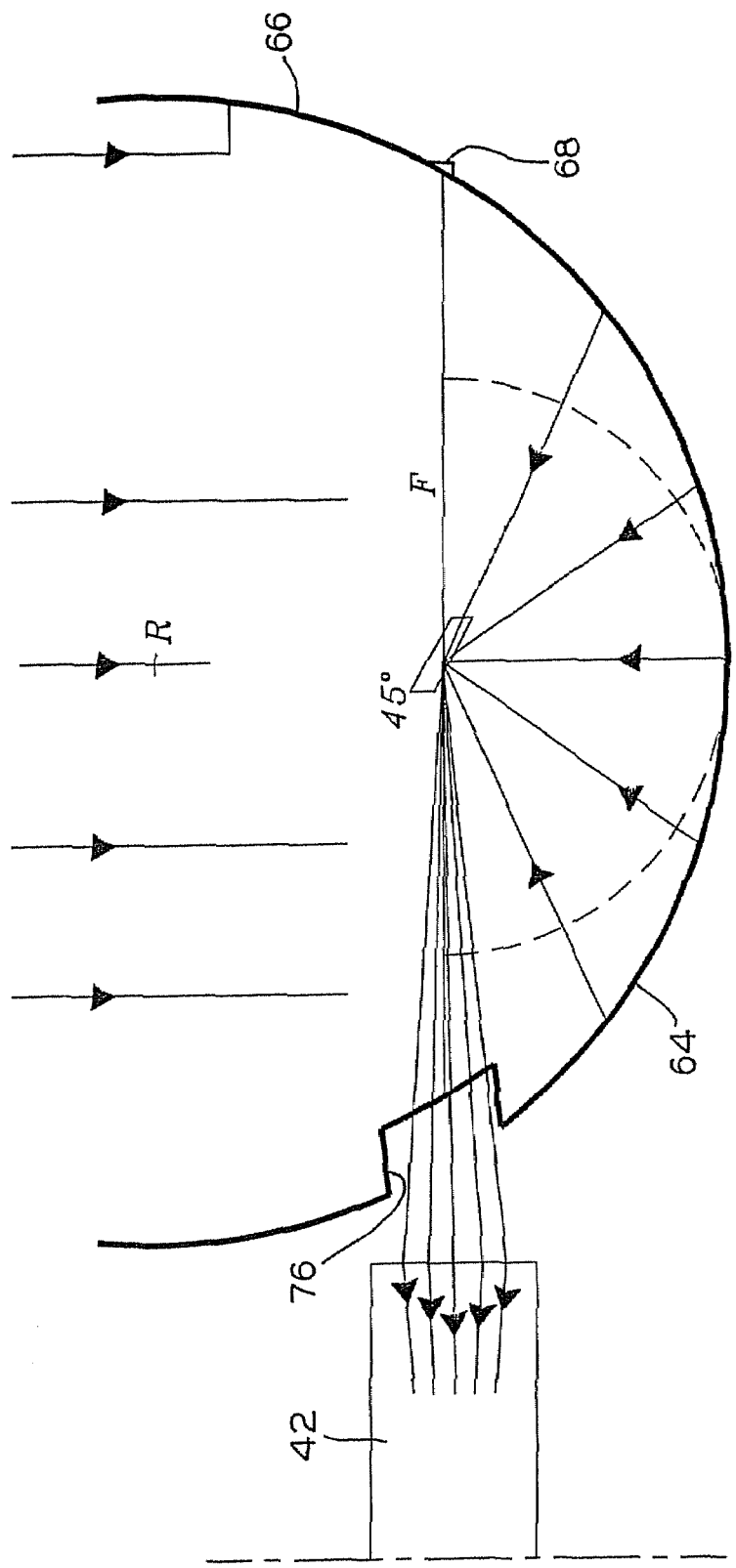
FIG. 5 shows the solar collecting system of the invention utilizing a deep-dish collecting panel.

FIGS. 5 and 10 show an embodiment wherein the solar collector panel 12 comprises a deep-dish parabolic panel 64. The collector panel 12 may be replaced with the deep dish panel 64 or a traditionally size collector panel 12 may be converted to a deep dish panel by means of a series of foldable flaps 66 having a predetermined curvature attached to a top rim of the parabolic panel 12 by means of hinges 68 or any other well-known means, which are capable of being folded upright to form the deep dish parabolic panel 64. The predetermined curvature of the series of flaps 66 forming the deep dish parabolic panel 64 must be equal to the predetermined radius "R" of the collector panel 12, to maintain a constant focal point "F". Also, these foldable flaps 66 must have a predetermined height that does not exceed the level of the radius of the parabolic collector panel. If this height is exceeded, such as above the focal point "F", then the rays will be blocked from the edge portions of the panel, compromising the total amount of reflective surface.

The series of flaps 66 can be formed from one of reflecting mirrors, photovoltaic material, and a combination of mirrors and photovoltaic material. These flaps may also be formed from a plurality of mirrors and photovoltaic panels that can be removed for maintenance and/or replacement as needed.

When using a deep-dish panel 64, a window 76, as shown in FIGS. 5 and 10, must be provided for allowing the redirected rays 14 moving along the third path 28 to escape through the panel 64. If a split mirror deflecting mirror 54 is being used, a pair of windows 76 in opposing side portions of the panel 64 are provided for sending redirected rays moving along the third and fourth paths 57, 59 to escape through deep dish collector panel 64. In the embodiment shown in FIG. 10, one of the windows 76 allows the second arm 31 to enter therethrough to mount the deflecting mirror 26, 54, and, if using the split mirror 54 embodiment, sending redirected rays moving along the fourth path 59 to escape through panel via fiber optic cord 72, as discussed in detail above.

Figure 11:
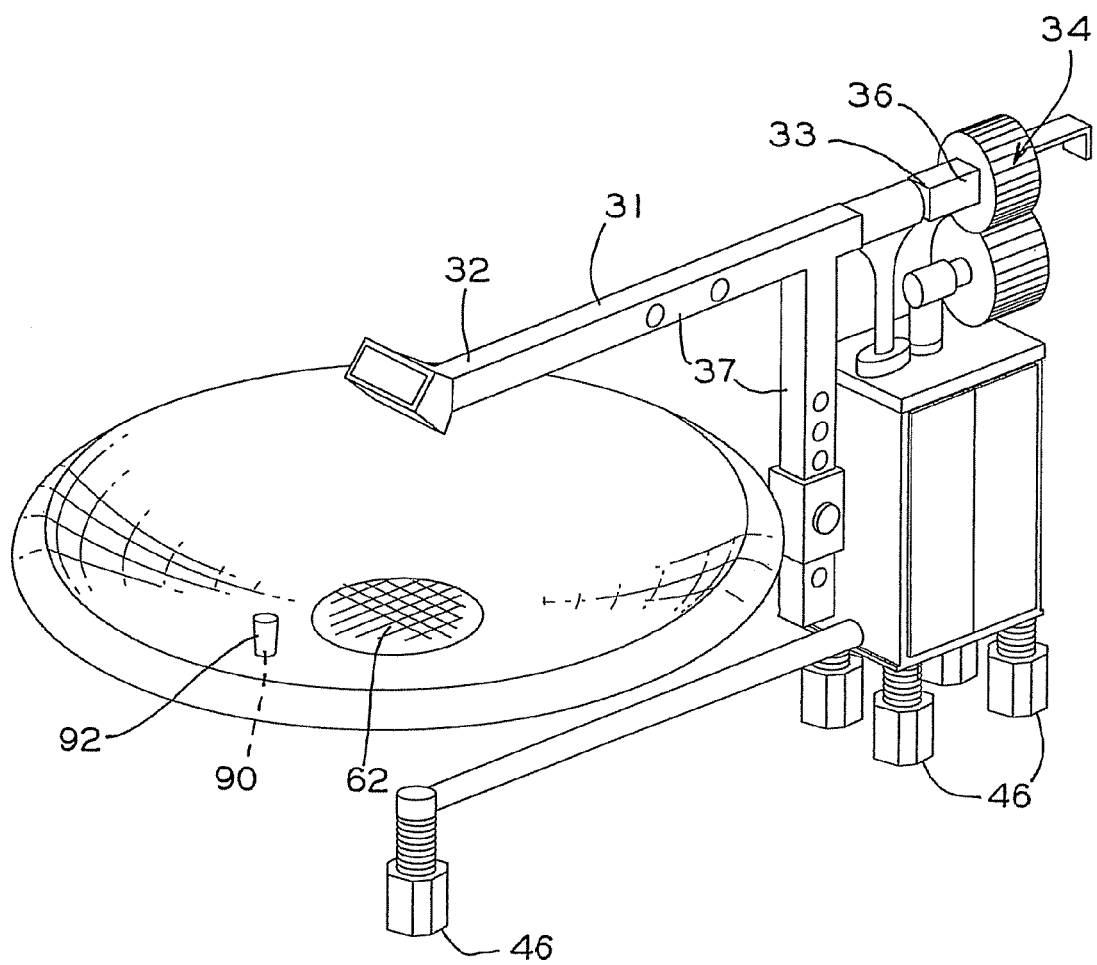
FIG. 11 shows the solar collecting system of FIG. 9 utilizing a photovoltaic cell sheet.

The invention further includes means to move one of the first arm and the means for mounting the deflecting mirror in a vertical direction to change the distance between the solar collector panel and the deflecting mirror from the focal point "F" to sub-focal point "SF". Any well-known adjusting means can be used. In FIG. 6, the height of rod or pole 30 or the height of the collector panel with respect to first arm 18 can be adjustable. As shown in FIGS. 9 and 11, a nut/bolt arrangement 78 and a plurality of holes 80 can be provided along the crossbeam 35 to allow for the adjustment of the collector panel 12 with respect to the second arm 31. Alternatively, the system can be configured such that the second arm 31 is movable with respect to the collector panel 12.

FIGS. 9 and 12 also show an optional protective cover 82 which may be formed from a clear or semi-clear plastic material. This plastic cover 82 can have a dome shape that can be opened partially or fully to cover the collecting system 10 of the invention in case of inclement weather. The system of the present invention can be modified as needed for a particular energy need. For example, as shown in FIG. 12, a plurality of collector panels, such as a traditional collector panel 12 in combination with a deep-dish panel 64, may be used to provide sufficient energy to operate turbine 44. Also, in case of inclement weather, back-up energy systems, such as a windmill 84, other stored energy devices and/or energy devices capable of storing excess solar energy produce by the system, can be provided to work in tandem with the system.

The present invention also provides for a photosensitive tracking system for tracking the path of the sun arc for use with the solar collecting system 10. This tracking system comprises a photocell 90, as shown in FIGS. 9-11. The photocell 90 is placed within the bottom of an upright cone shaped funnel 92. This funnel 92 is mounted either on the face of the at least one solar collecting panel 12 or adjacent to an outer edge portion of the at least one solar collecting panel 12. This cone shape funnel 92 can be mounted by any well-known means, i.e. adhesive, fusion, and the like, such that the upright portion is facing the sun. The funnel 92 is formed from a dark material such that light from the sun can only enter through the top portion thereof and contact the photocell 90.

Means are provided for communicating a signal from the photocell 90 to the power source operating gear assembly 34, such that when sunlight is entering into the upright funnel 92 and contacts photocell 90, the signal causes the power source to pause the rotation of the at least one solar collecting panel 12 until sunlight is no longer entering into the funnel 92. This pause in the rotation of the collecting panel 12 results in a face portion of the solar collecting panel 12 to remain in a substantially perpendicular position with respect to the sun. Consequently, as soon as the sun moves with respect to the photocell 90 so that the sun is no longer shining down into the funnel 92, a signal is sent to the gear operating motor to continue rotation of the solar collecting panel 12 at a speed that is comparable with the arc speed of the sun.

The photosensitive tracking system of the invention also provides a reference point on the solar collecting panel 12 to indicate a need for adjustment of the panel as a result of seasonal changes to optimize the amount of sun energy applied to the solar collector panel 12. Due to the perpendicular placement of the cone shaped funnel 92 with respect to the solar collecting panel, one having ordinary skill in the art can determined the need for adjustment based upon the location of shadows reflected on the panel 12.

Figure 13:
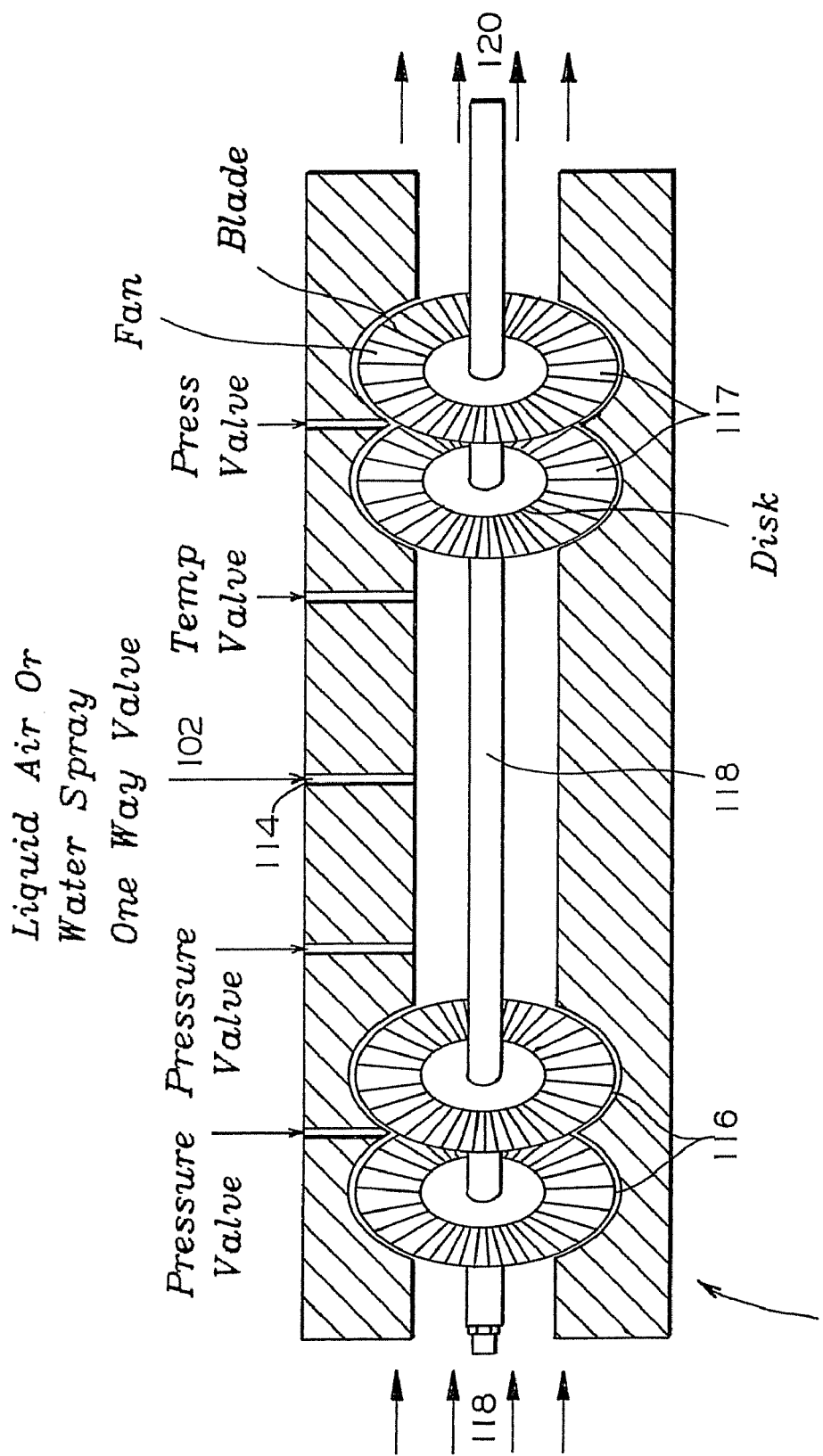
FIG. 13 shows a cross-sectional view of a turbine which may be powered by the solar collecting system of the invention.
Figure 14:
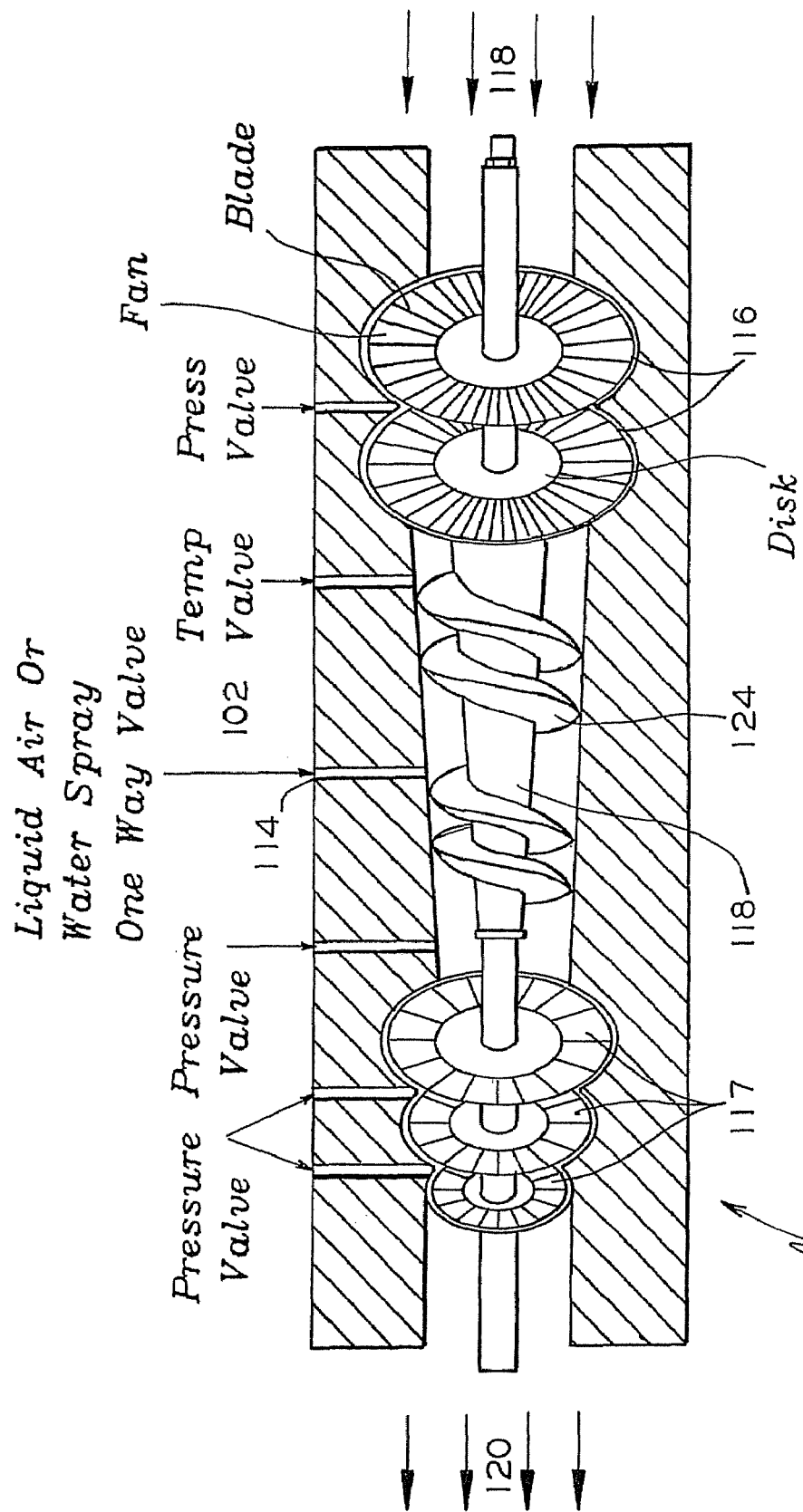
FIG. 14 shows a cross-sectional view of a turbine according to an alternative embodiment which may be powered by the solar collecting system of the invention.

As shown in FIG. 12, there is shown a turbine, generally indicated as 100, of which the rays 14, moving along the third path 28, can be applied in order to produce a rotational force which can be converted into electricity. The turbine casing is comprised of a black absorbent material capable of retaining heat therein. As shown in FIGS. 13-14, a medium 102, such as liquid/compressed air or distilled water enters the turbine via one-way valve 114. This medium is then heated to a temperature of approximately 800-900° F. by the solar energy applied directly to the sidewall of the turbine 100, causing the medium to expand and increase the pressure within the turbine 100. This pressure increase causes the fans/plates 116, 117 to rotate, drawing air into the turbine from the inlet 118 and exhausting this air through the outlet 120. The force of the pressure within the turbine 100 decreases as it moves through the turbine from the first set of fans/plates 116 to the second set of fans/plates 117. The maintenance of the pressure within the turbine 100 is controlled by a series of safety gages, feeding gages, pressure relief valves and temperature sensors. The force of the pressure differential within the turbine 100 causes the fans/plates 116, 117 to rotate in a single direction which consequently causes the shaft 118 to rotate. This rotational energy can then be converted into electrical energy by a connection to a generator or any other well known means. As shown in FIG. 14, additional rotating members 124 can be provided which contact the inside surface of the turbine 100 to provide additional rotational force and control of the movement of the air, as well as, provide additional stability to the shaft.

The invention has been described in such full, clear, concise, and exact terms so as to enable any person skilled in the art to which it pertains to make and use the same. It should be understood that variations, modifications, equivalents and substitutions for components of the specifically described embodiments of the invention may be made by those skilled in the art without departing from the spirit and scope of the invention as set forth in the appended claims. Persons who possess such skill will also recognize that the foregoing description is merely illustrative and not intended to limit any of the ensuing claims to any particular narrow interpretation.

I claim:

1. A solar collecting system for generating electrical power, heat energy, and!or steam, said system comprising:
   (a) a parabolic solar collector panel having a predetermined radius capable of receiving rays of the sun moving along a first path;
   (b) a first arm for mounting said panel for receiving said rays and reflecting said rays along a second path to one of a focal point, which is approximately ½ said predetermined radius, and a sub-focal point, which is less than ½ said predetermined radius, where said rays become at least partially condensed;
   (c) a second arm having a first end and a second end, said first end of said arm extending above and in a parallel plane with a portion of said solar collector panel;
   (d) a cross-beam extending between and connecting said first arm and said second arm to form a frame assembly;
   (e) at least one deflecting mirror mounted at said first end of said second arm at substantially one of said focal point and sub-focal point for receiving said condensed rays and redirecting said rays along at least a third path different from said first and second paths;
   (f) a gear assembly, the center of which is attached to a second end of said second arm, said gear assembly having a center portion inline with one of said focal point and said sub-focal point to form an imaginary axis wherein said at least one deflecting mirror is mounted inline with said imaginary axis at a fixed spatial location with respect to one of said focal point and said sub-focal point and said collector panel;
   (g) means for operating said gear assembly to rotate said frame assembly including said at least one deflecting mirror according to movement of the sun such that said collector panel travels over an arc path, the center of which is one of said focal point and said sub-focal point of said collector panel, said collector panel traveling over said arc path wherein said center of said arc path is ½ said radius or less than ½ said radius of said collector panel, said collector panel traveling over said arc path which is perpendicular with respect to said imaginary axis extending from said center portion of said gear assembly, one of said focal point and said sub-focal point, and substantially a center portion of said deflecting mirror, said means for operating said gear assembly maintaining said collector panel in a position which is perpendicular with said sun's rays and rotating said deflecting mirror upon itself to maintain said deflecting mirror inline with said imaginary axis and at said fixed spatial location with respect to one of said focal point and said sub-focal point and said collector panel during rotation at said imaginary axis; and
   (h) a final target for receiving said condensed rays from said third path and converting said rays into one of electrical power, heat energy and/or steam.

2. A solar collecting system as recited in claim 1 including means for adjusting said solar collector panel as a result of seasonal changes to optimize the amount of sun energy applied to said solar collector panel.

3. A solar collecting system as recited in claim 1 wherein said at least one deflecting mirror is mounted at an approximately 45° angle with respect to one of said focal point and said sub-focal point during rotation upon itself.

4. A solar collecting system as recited in claim 3 wherein said at least one deflecting mirror mounted at substantially one of said focal point and sub-focal point is capable of deflecting said rays from said second path and redirecting said condensed rays along said third path at an approximately 90° angle with respect to said first path.

5. A solar collecting system as recited in claim 1 wherein said deflecting mirror comprises a split mirror comprising a larger mirror having a center mirror portion mounted at an opposite angle with respect to said larger mirror and wherein said larger mirror is capable of redirecting a first portion of said condensed rays along said third path and said center mirror is capable of redirecting a second portion of said condensed rays along a fourth path which is different from said third path.

6. A solar collecting system as recited in claim 5 wherein said larger mirror and said center mirror are mounted at approximately 90° with respect to each other and mounted at an approximately 45° angle with respect to substantially one of said focal point and said sub-focal point for redirecting said condensed rays along said third and fourth paths at approximately 90° with respect to said first path and at approximately 180° with respect to each other.

7. A solar collecting system as recited in claim 6 wherein said second arm for mounting said deflecting mirror comprises a tubular member enclosing a fiber-optic cord for transmitting said rays along said fourth path.

8. A solar collecting system as recited in claim 7 including valves extending along the length of said tubular member to allow a cooling medium to circulate inside said member around said fiber optic cord and adjacent to said deflecting mirror.

9. A solar collecting system as recited in claim 6 wherein said solar collecting panel comprises a deep dish parabolic panel including a pair of windows in opposing side portions of said panel for allowing said second arm to enter through one of said windows and sending redirected rays moving along said fourth path to escape through said panel and for sending redirected rays moving along said third path to escape through the other of said window.

10. A solar collecting system as recited in claim 1 wherein said at least one deflecting mirror is capable of being removed from said second end of said second arm and wherein said second end is capable of receiving a replacement deflecting mirror in order to change one of the size and/or shape of said deflecting mirror, replace said deflecting mirror with a split mirror, and/or to perform maintenance on said deflecting mirror.

11. A solar collecting system as recited in claim 1 including at least one photovoltaic cell sheet mounted on said solar collector panel for providing energy capable of operating one of said gear motor or another accessory item.

12. A solar collecting system as recited in claim 1 including a photocell mounted on one of inside and outside said solar collector panel or on said solar collector panel for tracking the sun's movement with respect to said solar collector panel and for controlling movement of said panel along said arc such that said solar collector panel remains approximately perpendicular with respect to the sun's rays.

13. A solar collecting system as recited in claim 12 wherein said photocell is placed within an upright coned funnel and said photocell is capable of sending a signal for stopping the rotation of said solar collector panel upon the application of sunlight into said funnel and restarting the rotation of said solar collector panel upon removal of such sunlight within said funnel.

14. A solar collecting system as recited in claim 13 wherein said deep dish parabolic panel is formed by converting a shallow parabolic collector panel by means of a series of foldable flaps having a predetermined curvature attached to a top rim of the parabolic panel which are capable of being folded upright to form said deep dish parabolic panel, said predetermined curvature of said series of flaps forming said deep dish parabolic panel being equal to said predetermined radius to maintain a constant focal point and said foldable flaps having a predetermined height which produces a sidewall of said collector panel that does not exceed the level of said radius of said parabolic collector panel.

15. A solar collecting system as recited in claim 14 wherein said series of flaps are formed from one of reflecting mirrors, photovoltaic material, and a combination of mirrors and photovoltaic material.

16. A solar collecting system as recited in claim 1 wherein said solar collector panel comprises a deep dish parabolic panel.

17. A solar collecting system as recited in claim 16 including a window in a side portion of said deep dish panel for allowing said redirected rays moving along said third path to escape through said panel.

18. A solar collecting panel as recited in claim 1 wherein said condensed rays from said third path move through one of a lens box and/or lens frame to divert said rays according to a predetermined location of said final target.

19. A solar collecting system as recited in claim 18 wherein said lens box and/or lens frame includes at least one lens having one of a concave, convex, cylindrical shape, and any combination thereof capable of correcting any distortion of the condensed rays to said predetermined location.

20. A solar collecting system as recited in claim 18 including a first means for cooling one of said lens box, said lens frame, and said fiber optic cable and a second means for cooling said deflecting mirror.

21. A solar collecting system as recited in claim 1 wherein said solar collecting panel can comprise any shape capable of maintaining a constant focal point and can be formed from removable components comprising one of a series of multiple mirrors of varying sizes and/or shapes, a series of photovoltaic cells, and a combination of mirrors and photovoltaic cells, each of said components having said predetermined radius capable of maintaining said constant focal point.

22. A solar collector system as recited in claim 1 wherein said deflecting mirror comprises one of a flat, concave, and convex shape to correct ray condensation to send it on said third path for a predetermined distance.

23. A solar collector system as recited in claim 1 including means to move one of said first arm and said second arm in a vertical direction along said cross-beam to change the distance between said solar collector panel and said deflecting mirror from said focal point to said sub-focal point to disperse the rays over a larger surface area at the sub-focal point than a surface area at the focal point.

24. A solar collecting system for generating electrical power, heat energy, and/or steam, said system comprising:
(a) a parabolic solar collector panel having a predetermined radius capable of receiving rays of the sun moving along a first path;
(b) a first arm having a first end and a second end, said first end having said solar collector panel mounted thereon in a position capable of receiving said rays and reflecting said rays along a second path to one of a focal point, which is approximately ½ said predetermined radius, and a sub-focal point, which is less than ½ said predetermined radius, where said rays become at least partially condensed;
(c) at least one deflecting mirror mounted above said solar collector panel at substantially one of said focal point and sub-focal point for receiving said condensed rays and redirecting said rays along at least a third path different from said first and second paths;
(d) means for mounting said at least one deflecting mirror;
(e) a gear assembly attached to said second end of said first arm, said gear assembly having a center portion inline with one of said focal point and said sub-focal point to form an imaginary axis; and at a fixed spatial location with respect to one of said focal point and said sub-focal point and said collector panel;
(f) means for operating said gear assembly to rotate said collector panel and said at least one deflecting mirror according to movement of the sun such that said collector panel travels over an arc path, the center of which is one of said focal point and said sub-focal point of said collector panel, said collector panel traveling over said arc path wherein said center of said arc path is ½ said radius or less than ½ said radius of said collector panel, said collector panel traveling over said arc path which is perpendicular with respect to said imaginary axis extending from said center portion of said gear assembly, one of said focal point and said sub-focal point, and a center portion of said deflecting mirror, said means for operating said gear assembly maintaining said collector panel in a position which is perpendicular with said sun's rays and rotating said deflecting mirror upon itself to maintain said deflecting mirror inline with said imaginary axis and at said fixed spatial location with respect to one of said focal point and said sub-focal point and said collector panel;
(g) a final target for receiving said condensed rays from said third path and converting said rays into one of electrical power, heat energy and/or steam.

25. A solar collecting system as recited in claim 24 including means for adjusting said solar collector panel as a result of seasonal changes to optimize the amount of sun energy applied to said solar collector panel.

26. A solar collecting system as recited in claim 24 wherein said at least one deflecting mirror is mounted at an approximately 45° angle with respect to said one of said focal point and said sub-focal point during rotation upon itself.

27. A solar collecting system as recited in claim 26 wherein said at least one deflecting mirror mounted at substantially one of said focal point and said sub-focal point is capable of deflecting said rays from said second path and redirecting said condensed rays along said third path at an approximately 90° angle with respect to said first path.

28. A solar collecting system as recited in claim 24 wherein said deflecting mirror comprises a split mirror comprising a larger mirror having a center mirror portion mounted at an opposite angle with respect to said larger mirror and wherein said larger mirror is capable of redirecting a first portion of said condensed rays along said third path and said center mirror is capable of redirecting a second portion of said condensed rays along a fourth path which is different from said third path.

29. A solar collecting system as recited in claim 28 wherein said larger mirror and said center mirror are mounted at approximately 90° with respect to each other and mounted at an approximately 45° angle with respect to substantially one of said focal point and said sub-focal point for redirecting said condensed rays along said third and fourth paths at approximately 90° with respect to said first path and at approximately 180° with respect to each other.

30. A solar collecting system as recited in claim 28 wherein said solar collecting panel comprises a deep dish concave panel having a pair of windows in opposing side portions of said panel for sending redirected rays moving along said third and fourth paths to escape through said panel.

31. A solar collecting system as recited in claim 24 wherein said at least one deflecting mirror is capable of being removed from mounting means and wherein said mounting means is capable of receiving a replacement deflecting mirror in order to change one of the size and/or shape of said deflecting mirror, replace said deflecting mirror with a split mirror, and/or to perform maintenance on said deflecting mirror.

32. A solar collecting system as recited in claim 24 including at least one photovoltaic cell sheet mounted on said solar collector panel for providing energy capable of operating one of said gear motor or another accessory item.

33. A solar collecting system as recited in claim 24 including a photocell mounted one of inside and outside said solar collector panel or on said solar collector panel for tracking the sun's movement with respect to said solar collector panel and for controlling movement of said panel along said arc such that said solar collector panel remains approximately perpendicular with respect to the sun's rays.

34. A solar collecting system as recited in claim 33 wherein said photocell is positioned within a bottom portion of an upright coned funnel and wherein said photocell is capable of sending a signal for stopping the rotation of said solar collector panel upon the application of sunlight into said funnel and restarting the rotation of said solar collector panel upon removal of such sunlight within said funnel.

35. A solar collecting system as recited in claim 24 wherein said solar collector panel comprises a deep dish parabolic panel.

36. A solar collecting system as recited in claim 35 wherein said deep dish parabolic panel is formed by converting a shallow parabolic panel by means of a series of foldable flaps having a predetermined curvature attached to a top rim of the parabolic panel which are capable of being folded upright to form said deep dish parabolic panel, said predetermined curvature of said series of flaps forming said deep dish parabolic panel being equal to said predetermined radius to maintain a constant focal point and said foldable flaps having a predetermined height which does not exceed the level of said radius of said parabolic collector panel.

37. A solar collecting system as recited in claim 35 including a window in a side portion of said deep dish concave panel for allowing said redirected rays moving along said third path to escape through said panel.

38. A solar collecting system as recited in claim 36 wherein said series of flaps are formed from one of reflecting mirrors, photovoltaic material, and a combination of mirrors and photovoltaic material.

39. A solar collecting panel as recited in claim 24 wherein said condensed rays from said third path move through one of a lens box and/or lens frame to divert said rays according to a predetermined location of said final target.

40. A solar collecting system as recited in claim 39 wherein said lens box and/or lens frame includes at least one lens having one of a concave, convex, cylindrical shape, and any combination thereof capable of correcting any distortion of the condensed rays to said predetermined location.

41. A solar collecting system as recited in claim 39 including a first means for cooling one of said lens box, said lens frame, and said fiber optic cable and a second means for cooling said deflecting mirror.

42. A solar collecting system as recited in claim 24 wherein said solar collecting panel can comprise any shape capable of maintaining a constant focal point and can be formed from removable components comprising one of a series of multiple mirrors of varying sizes and/or shapes, a series of photovoltaic cells, and a combination of mirrors and photovoltaic cells, each of said components having said predetermined radius capable of maintaining said constant focal point.

43. A solar collector system as recited in claim 24 wherein said deflecting mirror comprises one of a flat, concave, and convex shape to correct ray condensation to send it on said third path for a predetermined distance.

44. A solar collector system as recited in claim 24 including means to move one of said first arm and said means for mounting said deflecting mirror in a vertical direction to change the distance between said solar collector panel and said deflecting mirror from said focal point to said sub-focal point to disperse the rays over a larger surface area at the sub-focal point than a surface area at the focal point.

45. A solar collecting system as recited in claim 24 wherein said final target for receiving said condensed rays from said third path comprises a turbine.

46. A solar collecting system for generating electrical power, heat energy, and/or steam, said system comprising:
  (a) a parabolic solar collector panel having a predetermined radius capable of receiving rays of the sun moving along a first path;
  (b) a first arm having a first end and a second end, said first end having said solar collector panel mounted thereon in a position capable of receiving said rays and reflecting said rays along a second path to one of a focal point, which is approximately ½ said predetermined radius, and a sub-focal point, which is less than ½ said predetermined radius, where said rays become at least partially condensed;
  (c) at least one deflecting mirror adjustably mounted above said solar collector panel at substantially one of said focal point and sub-focal point for receiving said condensed rays and redirecting said rays along at least a third path different from said first and second paths;
  (d) means for mounting said at least one deflecting mirror, said means for mounting configured for adjusting movement of the deflecting mirror between one of said focal point and said sub-focal point for adjustable concentration and dispersion of said rays at one of said focal point and said sub-focal point;
  (e) a gear assembly having a center portion attached to said second end of said first arm, said gear assembly having a center portion inline with one of said focal point and said sub-focal point to form an imaginary axis wherein said at least one deflecting mirror is mounted inline with said imaginary axis and at a fixed spatial location with respect to one of said focal point and said sub-focal point and said collector panel;
  (f) means for operating said gear assembly to rotate said collector panel and said at least one deflecting mirror according to movement of the sun such that said collector panel travels over an arc path, the center of which is one of said focal point and said sub-focal point of said collector panel, said collector panel traveling over said arc path wherein said center of said arc path is ½ said radius or less than ½ said radius of said collector panel, said collector panel traveling over said arc path which is perpendicular with respect to said imaginary axis extending from said center portion of said gear assembly, one of said focal point and said sub-focal point, and a center portion of said deflecting mirror, said means for operating said gear assembly maintaining said collector panel in a position which is perpendicular with said sun's rays and rotating said deflecting mirror upon itself to maintain said deflecting mirror inline with said imaginary axis and at said fixed spatial location with respect to one of said focal point and said sub-focal point and said collector panel;

(g) a stationary final target for receiving said condensed rays from said third path and converting said rays into one of electrical power, heat energy, and/or steam.

* * * * *

UNITED STATES PATENT AND TRADEMARK OFFICE
CERTIFICATE OF CORRECTION

PATENT NO. : 7,640,931 B2  Page 1 of 1
APPLICATION NO. : 11/512913
DATED : January 5, 2010
INVENTOR(S) : Tarabishi It is certified that error appears in the above-identified patent and that said Letters Patent is hereby corrected as shown below:

Column 9, Line 14, Claim 1, "and!or" should read -- and/or --

Column 10, Line 4, Claim 3, "mounted at" should read -- mounted and maintained at --

Column 10, Line 67, Claim 13, "within an" should read -- within a bottom portion of an --

Column 12, Line 17, Claim 24, "axis; and" should read -- axis wherein said at least one deflecting mirror is mounted inline with said imaginary axis and --

Column 12, Line 47, Claim 26, "mounted at an" should read -- mounted at and maintained at an --

Column 13, Line 23, Claim 33, "mounted one" should read -- mounted on one --

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,640,931 B2 | Page 1 of 1 |
| APPLICATION NO. | : 11/512913 | |
| DATED | : January 5, 2010 | |
| INVENTOR(S) | : Tarabishi | |

It is certified that error appears in the above-identified patent and that said Letters Patent is hereby corrected as shown below:

Title page, (*) Notice: Delete "352 days" and insert --460 days--

Signed and Sealed this

Twenty-seventh Day of July, 2010

David J. Kappos
*Director of the United States Patent and Trademark Office*